(12) United States Patent
Fukuda et al.

(10) Patent No.: US 7,495,319 B2
(45) Date of Patent: Feb. 24, 2009

(54) RESIN-ENCAPSULATED SEMICONDUCTOR DEVICE AND LEAD FRAME, AND METHOD FOR MANUFACTURING THE SAME

(75) Inventors: Toshiyuki Fukuda, Nagaokakyo (JP); Masanori Minamio, Takatsuki (JP); Hiroaki Fujimoto, Hirakata (JP); Ryuichi Sahara, Hirakata (JP); Kenichi Itou, Takatsuki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/071,343

(22) Filed: Mar. 3, 2005

(65) Prior Publication Data

US 2005/0194676 A1 Sep. 8, 2005

(30) Foreign Application Priority Data

Mar. 4, 2004 (JP) ............... 2004-060943

(51) Int. Cl.
H01L 23/495 (2006.01)
(52) U.S. Cl. .................. 257/666; 257/676; 257/686; 438/107; 438/108; 438/109
(58) Field of Classification Search ............. 438/111, 438/112, 123, FOR. 336, FOR. 337, FOR. 367, 438/107, 108, 109; 257/666, 670, 673, 676, 257/723, 777, 123
See application file for complete search history.

(56) References Cited

U.S. PATENT DOCUMENTS

| | | | |
|---|---|---|---|
| 5,471,088 A * | 11/1995 | Song | 257/668 |
| 6,337,510 B1 * | 1/2002 | Chun-Jen et al. | 257/666 |
| 6,498,392 B2 * | 12/2002 | Azuma | 257/676 |
| 6,552,419 B2 * | 4/2003 | Toyosawa | 257/668 |
| 7,138,707 B1 * | 11/2006 | Lee et al. | 257/684 |
| 2003/0230792 A1 * | 12/2003 | Wu et al. | 257/666 |
| 2005/0110121 A1 * | 5/2005 | Minamio et al. | 257/669 |

FOREIGN PATENT DOCUMENTS

| | | | |
|---|---|---|---|
| JP | 06-209069 | * | 7/1994 |
| JP | 2001-68585 | | 3/2001 |

(Continued)

Primary Examiner—W. David Coleman
Assistant Examiner—Su C Kim
(74) Attorney, Agent, or Firm—Hamre, Schumann, Mueller & Larson, P.C.

(57) ABSTRACT

There are provided a lead frame including a plurality of first external terminal portions 5 provided on a plane, inner lead portions 6 formed of back surfaces of the respective first external terminal portions and arranged so as to surround a region inside the inner lead portions, and second external terminal portions 7 formed of uppermost surfaces of convex portions positioned outside the respective inner lead portions; a semiconductor element 2 flip-chip bonded to the inner lead portions via bumps 3; and an encapsulating resin 4 encapsulating surroundings of the semiconductor element and the inner lead portions. The first external terminal portions are arranged in a lower surface region of the encapsulating resin along a periphery of the region, and the second external terminal portions are exposed on an upper surface of the encapsulating resin. A plurality of terminals 8 for electrical connection are provided in a grid pattern in a region inside the first external terminal portions and exposed on a lower surface of the encapsulating resin. A plurality of semiconductor elements or coils and resistors can be incorporated, and further semiconductor devices can be stacked.

11 Claims, 18 Drawing Sheets

FOREIGN PATENT DOCUMENTS

| | | |
|---|---|---|
| JP | 2001-77277 | 3/2001 |
| JP | 2001-177007 | 6/2001 |
| JP | 2001-332866 | 11/2001 |
| JP | 2002-26181 | 1/2002 |
| JP | 2002-43554 | 2/2002 |
| JP | 2002-170921 | 6/2002 |
| JP | 2003-197822 | 7/2003 |
| JP | 2003-249604 | 9/2003 |
| JP | 2003197822 | * 11/2003 |

* cited by examiner

US 7,495,319 B2

RESIN-ENCAPSULATED SEMICONDUCTOR DEVICE AND LEAD FRAME, AND METHOD FOR MANUFACTURING THE SAME

BACKGROUND OF THE INVENTION

1. Field of the Invention

The present invention relates to a resin-encapsulated semiconductor device in which a semiconductor element is bonded on inner leads of a lead frame and the surroundings thereof are encapsulated with a resin, and that allows other semiconductor devices or functional components such as a resistor to be stacked in a vertical direction.

2. Description of the Related Art

In recent years, in order to cope with miniaturized and high-density electronic equipment, high-density packaging of semiconductor components such as a resin-encapsulated semiconductor device has been demanded, and accordingly smaller and thinner semiconductor components have been developed. For example, the type of a package is being changed from a peripheral package in which external terminals are provided on the periphery of a semiconductor device to an area array package in which external terminals are provided in a grid pattern on a mounting surface of a semiconductor device. Further, semiconductor devices that are small and thin and yet have a large number of pins also have been developed.

Hereinafter, a conventional resin-encapsulated semiconductor device will be described. In recent years, a resin-encapsulated semiconductor device called "QFN (Quad Flat No-lead Package)" in which one side thereof is molded actually has been developed as a small and thin resin-encapsulated semiconductor device (see JP 2001-77277 A, for example).

Initially, the QFN-type resin-encapsulated semiconductor device in which a die pad is exposed on a bottom surface of a package will be described as a conventional resin-encapsulated semiconductor device. FIGS. 18A to 18D illustrate the conventional QFN-type resin-encapsulated semiconductor device; FIG. 18B is a plan view and FIG. 18A is a cross-sectional view taken along line I-I in FIG. 18B. In addition, FIGS. 18C and 18D illustrate a most commonly used QFP (Quad Flat Package)-type resin-encapsulated semiconductor device, in which external terminals protrude from a packaging resin toward a periphery thereof FIG. 18C is a cross-sectional view and FIG. 18D is a plan view.

As shown in FIGS. 18A and 18B, the conventional QFN-type resin-encapsulated semiconductor device has a structure in which a semiconductor element 52 is bonded on a die pad 51 of a lead frame and a plurality of inner lead portions 53 are arranged so that ends thereof are opposed to the die pad 51. Electrodes of the semiconductor element 52 are connected electrically with surfaces of the inner lead portions 53 via thin metal wires 54. The surroundings of the semiconductor element 52, the die pad 51, the inner lead portions 53, and the thin metal wires 54 are encapsulated with an encapsulating resin 55. Bottom surfaces and outer lateral surfaces of the inner lead portions 53 are exposed on a bottom surface and lateral surfaces, respectively, of the package from the encapsulating resin 55, so as to be arranged as external terminals 56.

Further, as shown in FIGS. 18C and 18D, the conventional QFP type resin-encapsulated semiconductor device also has a structure in which the semiconductor element 52 is bonded on a die pad 57 of a lead frame and a plurality of inner lead portions 58 are arranged so that ends thereof are opposed to the die pad 57. Electrodes of the semiconductor element 52 are connected electrically with surfaces of the inner lead portions 58 via thin metal wires 59. The surroundings of the semiconductor element 52, the die pad 57, the inner lead portions 58, and the thin metal wires 59 are encapsulated with an encapsulating resin 60. Trailing ends of the inner lead portions 58 protrude from lateral surfaces of the encapsulating resin 60, so as to be arranged as external terminals 61 on outer lateral surfaces of the package.

The lead frame used in the conventional resin-encapsulated semiconductor device, which is not shown in the figures, includes the die pad 51 arranged substantially at the center in an opening region of a frame, hanging lead portions 62 for supporting the die pad 51, one end of each of them being connected to each corner of the die pad 51, the other end thereof being connected to the frame, and the plurality of inner lead portions 53 arranged so that ends thereof are opposed to corresponding edges of the die pad 51.

In an attempt to make the conventional resin-encapsulated semiconductor device with these structures smaller and have higher density, the peripheral type semiconductor devices, such as QFN, in which external terminals are arranged on the periphery of the semiconductor devices, have been replaced by area array type semiconductor devices having higher density, such as BGA (Ball Grid Array), in which external terminals are arranged in a grid pattern on a bottom surface of the semiconductor devices. However, due to limitations on the processing of a line and space (design of a wiring pattern) of a substrate to be mounted and limitations imposed by a method of mounting by a reflow process using a solder cream, the smallest possible pitch of the external terminals that allows these semiconductor devices to be mounted on the substrate is 0.4 mm in the case of the peripheral type semiconductor devices such as QFN and 0.65 mm in the case of the area array type semiconductor devices such as BGA. Thus, further miniaturization and high-density packaging of the resin-encapsulated semiconductor devices are becoming difficult.

Further, there is a need for a semiconductor device commensurate with a higher functionality of sets typified by mobile phones and the like. In the case of a mobile phone, for example, a frequency band of not less than 1 GHz in use has been utilized already to realize stable communications or large-capacity data communications in a current industrial field of mobile communications (mobile phones, PDAs, and the like). In the future, there will be an increasing need for signal communications in a higher frequency band.

SUMMARY OF THE INVENTION

An object of the present invention is to provide a resin-encapsulated semiconductor device in which a plurality of semiconductor elements or coils and resistors for supporting the function of the semiconductor elements can be incorporated, and that allows other semiconductor devices to be stacked, and a method for manufacturing the same.

A resin-encapsulated semiconductor device according to the present invention includes: a lead frame including a plurality of first external terminal portions provided on a plane, inner lead portions that are formed of back surfaces of the respective first external terminal portions and arranged at regular intervals so as to surround a region inside the inner lead portions, and second external terminal portions formed of uppermost surfaces of convex portions positioned outside the respective inner lead portions; a semiconductor element whose connection pads are flip-chip bonded to the inner lead portions via bumps; and an encapsulating resin that encapsulates at least a part of surroundings of the semiconductor element including the inner lead portions and connection parts via the bumps. The first external terminal portions are arranged in a lower surface region of the encapsulating resin along a periphery of the region, and the second external terminal portions are exposed on an upper surface of the encapsulating resin. Further, a plurality of terminals for electrical connection are provided in a grid pattern in a region inside the first external terminal portions and exposed on a lower surface of the encapsulating resin.

A lead frame according to the present invention includes: a plurality of first external terminal portions provided on a plane; inner lead portions that are formed of back surfaces of the respective first external terminal portions and arranged at regular intervals so as to surround a region inside the inner lead portions; and second external terminal portions formed of uppermost surfaces of convex portions positioned outside the respective inner lead portions. A plurality of terminals for electrical connection are provided in a grid pattern in the region inside the inner lead portions.

A method for manufacturing a resin-encapsulated semiconductor device according to the present invention includes: preparing a lead frame having the above-mentioned configuration; forming conductive bumps on electrodes of a first semiconductor element; connecting the electrodes of the first semiconductor element with predetermined positions of the inner lead portions and the terminals for electrical connection, respectively, via the conductive bumps; encapsulating the inner lead portions, the first semiconductor element, and the conductive bumps with a resin; and separating the encapsulated structure from a frame.

A method for manufacturing a lead frame according to the present invention is a method for manufacturing a lead frame having the above-mentioned configuration. The method includes: preparing a lead frame in which terminals to be independent of each other are connected; forming a plated layer on the lead frame; applying a protective sheet to a surface on one side of the lead frame in which the terminals to be independent of each other are connected; separating connected parts between the terminals to be independent of each other; and providing a plurality of terminals for electrical connection in the region inside the arranged inner lead portions.

BRIEF DESCRIPTION OF THE DRAWINGS

FIGS. 6A and 6B are perspective views illustrating respective steps of the process, FIG. 6C is an enlarged perspective view of a part of FIG. 6A, and FIG. 6D is an enlarged side view of a part of FIG. 6C.

FIGS. 18A and 18C are cross-sectional views and FIGS. 18B and 18D are back views.

DETAILED DESCRIPTION OF THE INVENTION

Figure 1A:
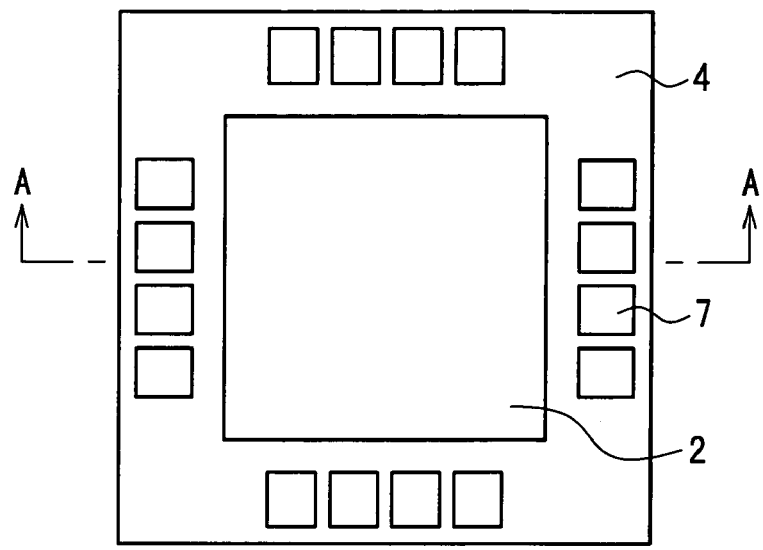
FIG. 1A is a plan view illustrating a resin-encapsulated semiconductor device according to Embodiment 1.

According to a resin-encapsulated semiconductor device of the present invention, it is possible to form external terminals on an upper and a lower surfaces of a peripheral type resin-encapsulated semiconductor device in which external terminals are arranged on the periphery of the semiconductor device, provide coils or resistors in the semiconductor device, and stack semiconductor devices having a different number of pins and the like freely.

In the resin-encapsulated semiconductor device according to the present invention, each of the terminals for electrical connection can be used for a power source or GND and have a larger area than the other terminals. Alternatively, the plurality of terminals for electrical connection that comprise two terminals can form a starting point and an ending point, respectively, of a spiral coil. Alternatively, the plurality of terminals for electrical connection can comprise two terminals with a resin having a high dielectric constant sandwiched therebetween.

The semiconductor element may have a plurality of electrode pads in a region inside the flip-chip bonded region, and a second semiconductor element that is smaller than a region inside inner ends of the inner lead portions and thinner than the inner lead portions of the lead frame further may be flip-chip bonded to the electrode pads.

A back surface of a third semiconductor element may be bonded on the second external terminal portions via an adhesive, and a plurality of inner lead posts may be provided in a region outside the inner lead portions, the inner lead posts being connected electrically with electrode pads of the third semiconductor element via thin metal wires, and having their opposite surfaces exposed in the lower surface region of the encapsulating resin.

In the lead frame according to the present invention, for example, spiral wiring can be provided in the region inside the inner lead portions and the terminals for electrical connection can form a starting point and an ending point, respectively, of the spiral wiring. Alternatively, the plurality of terminals for electrical connection can comprise two terminals with a resin having a high dielectric constant sandwiched therebetween. Further, the lead frame having the above-mentioned configuration further can include an insulating protective sheet for supporting the other elements.

The method for manufacturing a resin-encapsulated semiconductor device according to the present invention further can include: preparing a second semiconductor element that is smaller than a region inside inner ends of the inner lead portions and thinner than the inner lead portions of the lead frame; forming a plurality of electrode pads in a region inside a region for flip-chip bonding via the conductive bumps in the first semiconductor element; connecting the second semiconductor element to the electrode pads formed in the inside region when the first semiconductor element is in a wafer state; and dividing the wafer into units of the first semiconductor element. In the step of connecting the electrodes of the first semiconductor element with predetermined positions of the inner lead portions and the terminals for electrical connection, the first semiconductor element to which the second semiconductor element is connected is supplied.

The method for manufacturing a lead frame according to the present invention can further include: providing two terminals for electrical connection, injecting a resin with a high dielectric constant between the two terminals, and curing the resin. Alternatively, the inner lead portions can be arranged at regular intervals on a periphery of a region in which a semiconductor device is to be mounted, and a resistor with two terminals can be provided in the region inside the inner lead, each of the two terminals of the resistor having a region to be an upper surface that is sufficiently large so as to allow bump bonding.

Hereinafter, the resin-encapsulated semiconductor device and a lead frame used therein according to each embodiment of the present invention will be described with reference to the drawings.

Embodiment 1

Figure 1B:
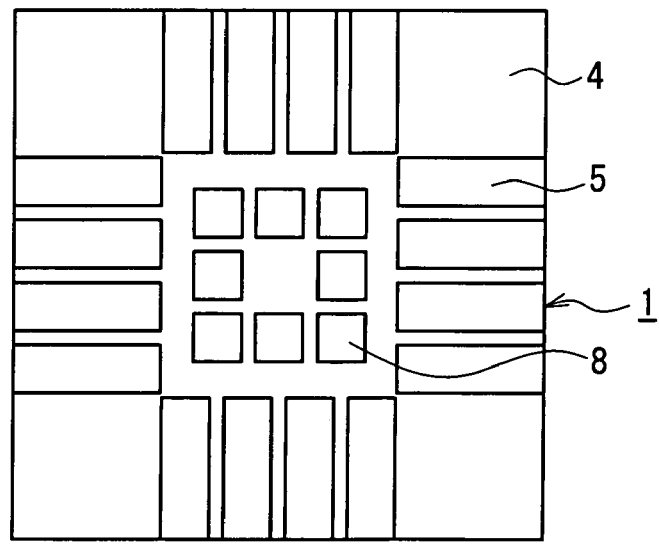
FIG. 1B is a back view thereof.
Figure 1C:
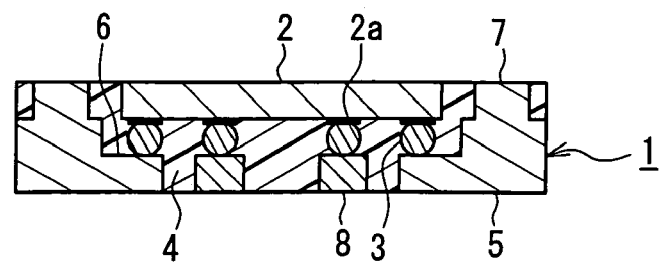
FIG. 1C is a cross-sectional view thereof taken along line A-A in FIG. 1A.

FIG. 1A is a plan view illustrating a resin-encapsulated semiconductor device according to Embodiment 1, FIG. 1B is a back view thereof, and FIG. 1C is a cross-sectional view thereof taken along line A-A in FIG. 1A.

As shown in FIG. 1C, the resin-encapsulated semiconductor device has s structure in which a first semiconductor element 2 is mounted on an upper surface of a lead frame 1 via metal bumps 3 by flip-chip bonding and a connection part located between the lead frame 1 and the first semiconductor element 2 is encapsulated with an encapsulating resin 4.

The lead frame 1 includes a plurality of first external terminal portions 5 arranged on a plane as shown in FIG. 1B and inner lead portions 6 formed of surfaces opposite to the first external terminal portions 5. Further, as shown in FIGS. 1A and 1C, second external terminal portions 7 are formed of uppermost surfaces of convex portions positioned in a part of the respective inner lead portions 6. The inner lead portions 6 are arranged at regular intervals so as to surround a region inside the inner lead portions. The lead frame 1 further includes a plurality of terminals 8 for electrical connection provided in the region inside the inner lead portions 6. The first external terminal portions 5, the second external terminal portions 7, and the terminals 8 are exposed from the encapsulating resin 4.

Herein, in the semiconductor device, it is preferable that a distance in which high-frequency electric signals are transmitted is shorter. When a design layout of the semiconductor element 2 allows the terminals 8 to be arranged at positions to which signals are allowed to be transmitted more directly, preferable electrical characteristics can be obtained. A power source ground also is located according to the design layout of the semiconductor element 2.

Figure 2C:
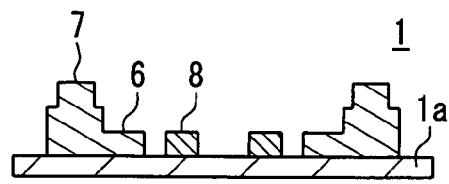
FIGS. 2C to 2F are cross-sectional views of respective steps of the process.
Figure 2A:
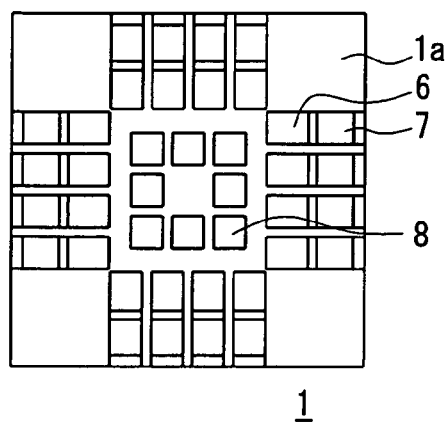
FIG. 2A is a plan view of a lead frame for illustrating a part of a manufacturing process of the resin-encapsulated semiconductor device.
Figure 2D:
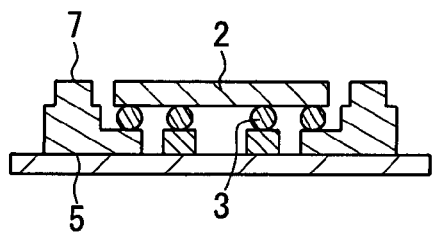
Figure 2B:
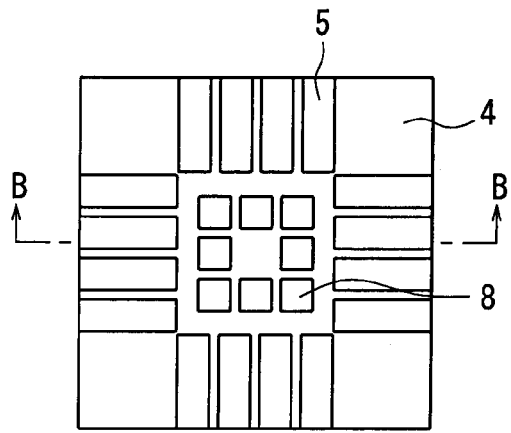
FIG. 2B is a back view of the resin-encapsulated semiconductor device manufactured by the process.

FIGS. 2A to 2F are views illustrating a part of a manufacturing process of the resin-encapsulated semiconductor device shown in FIGS. 1A to 1C. FIG. 2A is a plan view of the lead frame 1. FIG. 2B is a back view of the resin-encapsulated semiconductor device manufactured by the process. FIGS. 2C to 2F are cross-sectional views taken along line B-B in FIG. 2B that illustrate respective steps of the process.

Initially, as shown in FIG. 2C, the lead frame 1 is prepared. A lower surface of the lead frame 1 is held by a lead frame holding sheet 1a. Then, as shown in FIG. 2D, the semiconductor element 2 is mounted on the lead frame 1. In other words, electrode pads 2a of the semiconductor element 2 are connected with the inner lead portions 6 of the lead frame 1 via the bumps 3.

Figure 2E:
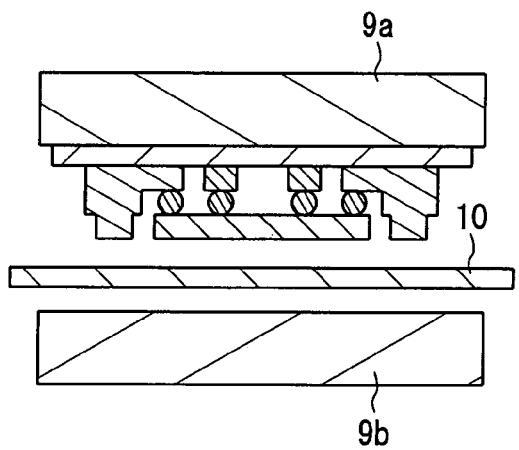

Then, as shown in FIG. 2E, the semiconductor element 2 and the inner lead portions 6 of the lead frame 1 are encapsulated with the encapsulating resin. More specifically, the lead frame 1 to which the semiconductor element 2 has been bonded is placed between resin encapsulating molds 9a and 9b, which is then filled with the encapsulating resin. Although only one semiconductor device is shown in the figure, actually resin-encapsulated semiconductor devices arranged adjacent to each other in a grid pattern may be encapsulated with the resin in a block form. At this time, an encapsulating sheet 10 may be provided between the lead frame 1 and the encapsulating mold 9b. The first external terminal portions 5, the second external terminal portions 7, and the terminals 8 of the lead frame 1 are exposed on a surface of the resin. Herein, a thermosetting epoxy resin, for example, is used as the encapsulating resin, and a resin molding temperature is set in a range of 150 to 250° C.

Figure 2F:
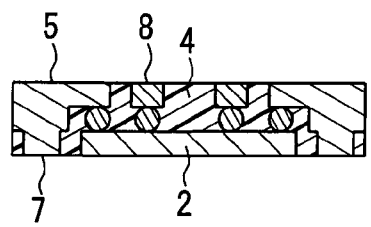

After the encapsulation, as shown in FIG. 2F, the adjacent resin-encapsulated semiconductor devices are divided along dividing lines. In this step, when the resin-encapsulated semiconductor devices have a total thickness of not more than 0.2 mm, they can be divided by a laser-cutting method. On the other hand, when the resin-encapsulated semiconductor devices have a total thickness of more than 0.2 mm, they are divided using a saw, since when the laser cutting method is used, the handling of dross of a molten metal on laser dividing surfaces becomes a problem in terms of dividing time (index) and quality.

In encapsulating, as shown in FIG. 2E, when the encapsulating sheet 10 is applied to a surface on one side of the lead frame 1, the encapsulating sheet 10 contacts with portions that are to become the second external terminal portions 7 when the encapsulation is carried out, thereby preventing resin burr. Further, since the lead frame 1 slightly intrudes into the encapsulating sheet 10, a standoff can be formed. For example, when the encapsulating sheet 10 has a thickness of 30 μm, a standoff of 2 μm to 10 μm is formed. However, even when the encapsulating sheet 10 is not used, the thickness of the material of the lead frame 1 amounts to the total thickness of the resin-encapsulated semiconductor device, and thus a compressive force of the resin encapsulating molds 9a and 9b can be provided stably. Therefore, resin burr can be eliminated sufficiently by a process using conventional chemicals.

Figure 3:
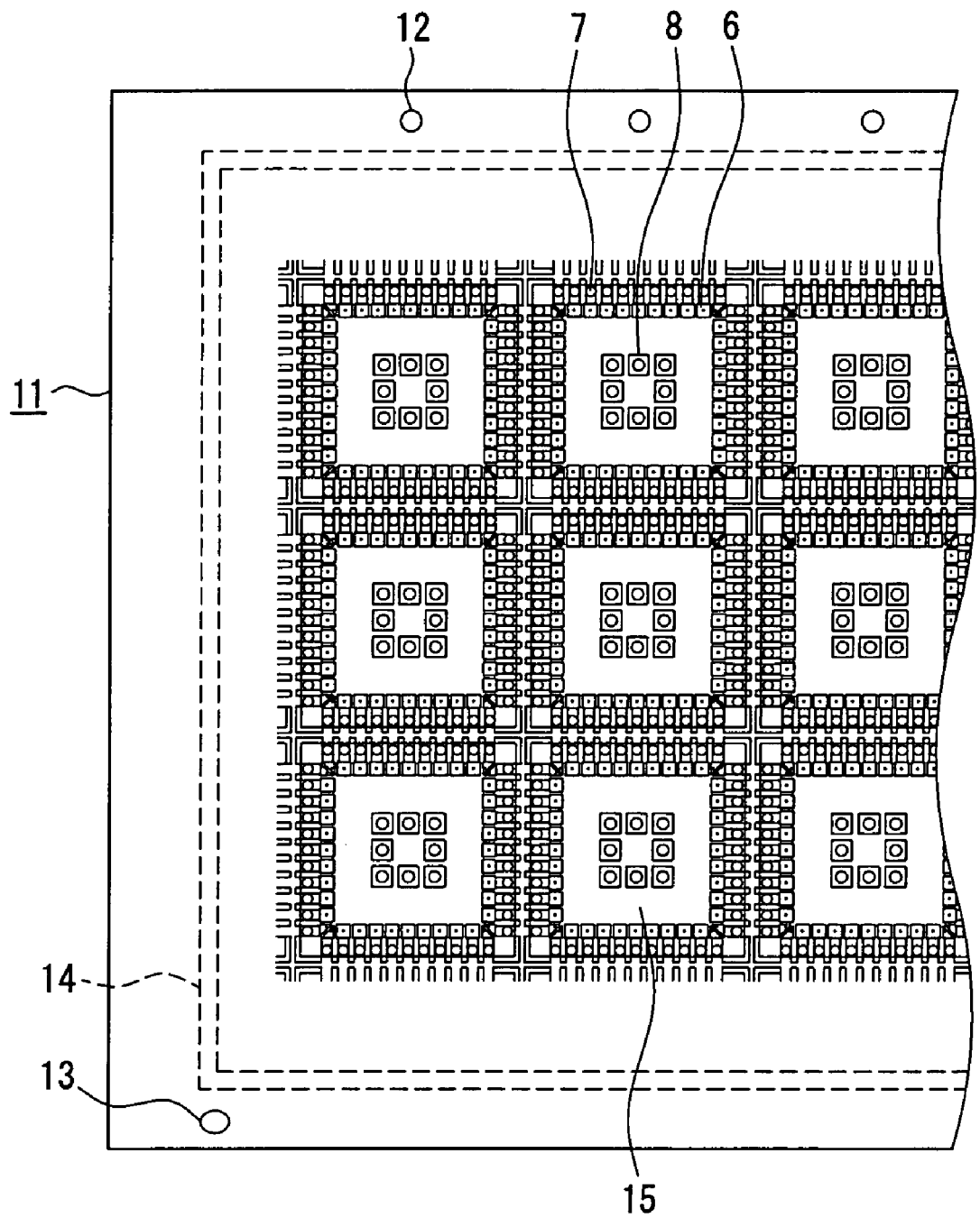
FIG. 3 is a plan view illustrating a part of a lead frame for use in the resin-encapsulated semiconductor device.

FIG. 3 is a plan view illustrating a part of an exemplary lead frame used in this embodiment. A lead frame 11 includes a plurality of positioning holes (circular holes) 12 and positioning holes (elliptical holes) 13 on both ends thereof in a shorter direction. A region 14 to be encapsulated with the resin is indicated inside the positioning holes 12 and 13, and a plurality of regions 15 for mounting the elements are arranged in a grid pattern inside the region 14 to be encapsulated with the resin. The number of the regions 15 for mounting the elements to be arranged depends upon the size of the semiconductor device. Further, the number of external terminals (the number of pins) and a design within the regions 15 for mounting the elements vary depending upon the size, the number of output and input terminals, and the like of the semiconductor elements to be mounted.

Herein, the lead frame 11 of this embodiment has, for example, lengths of 30 to 80 mm in the shorter direction and 50 to 260 mm in a longitudinal direction, and a thickness of 0.1 to 0.4 mm. Further, the lead frame 11 is made of an Fe—Ni material, a Cu alloy, or the like. The size of the resin-encapsulated semiconductor device to be arranged generally is 3.0×3.0 mm to 20.0×20.0 mm.

An Fe—Ni material, a Cu alloy, or the like as a material of the lead frame 11 of this embodiment may be provided with a plated metal, which is required for the bonding or the mounting of the semiconductor element. As a plating material, Ag, Au, Ni—Pd, or the like is used. However, in the case of Ag plating in particular, it is provided only on the inner lead portions, and in a later step of manufacturing the semiconductor device, Sn—Pb plating or Sn—Bi plating is required to be provided on portions that are to become the external terminal portions formed of surfaces opposite to the inner lead portions. The thickness of the plating provided on the lead frame 11 is not more than 1 μm in the case of Au plating and Pd plating, and not more than several μM in the case of Ag plating. Although not shown in FIG. 3, in order to assemble the semiconductor device stably, a heat-resistant base material such as polyimide or an aluminum foil may be applied temporarily to a surface of the lead frame 11 opposed to a surface to which semiconductor elements are to be bonded.

FIGS. 4A to 4E are cross-sectional views of the vicinity of the inner lead portion in the region 15 for mounting the element of the lead frame 11 in combination with the semiconductor element 2 provided with the bump 3.

Figure 4A:
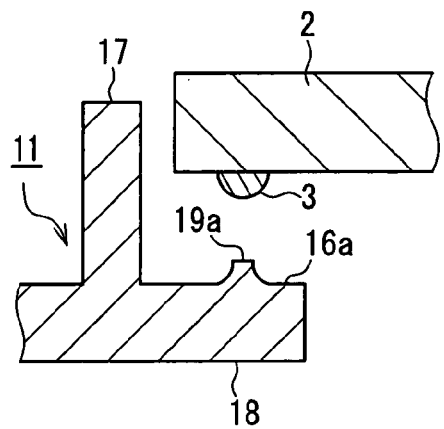
FIGS. 4A to 4E are cross-sectional views showing examples of the shape of the lead frame in the vicinity of an inner lead portion.
Figure 4B:
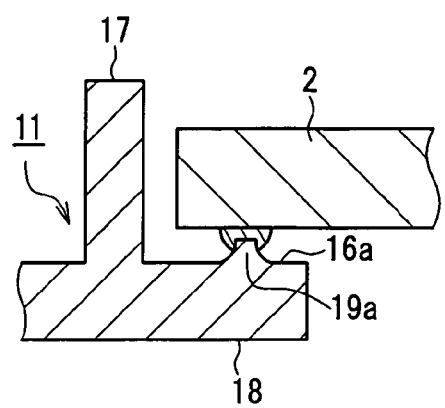

FIG. 4A illustrates an inner lead portion 16a as a first example. A convex second external terminal portion 17 that has a rectangular, elliptical, or cylindrical shape and has a width equal to or smaller than that of the inner lead portion 16a is provided in a region apart from an end portion of the inner lead portion 16a. The end portion of the inner lead portion 16a has a region broader than a lead that is to become a first external terminal portion 18. A circular trapezoidal convex portion 19a protruding is formed on a plane of the broad region at the end of the inner lead portion 16a. The convex portion 19a is positioned so as to correspond to a position of the bump 3 provided on an electrode pad of the semiconductor element 2. FIG. 4B shows the state where the semiconductor element 2 with the bump 3 is bonded to the convex portion 19a.

Figure 4C:
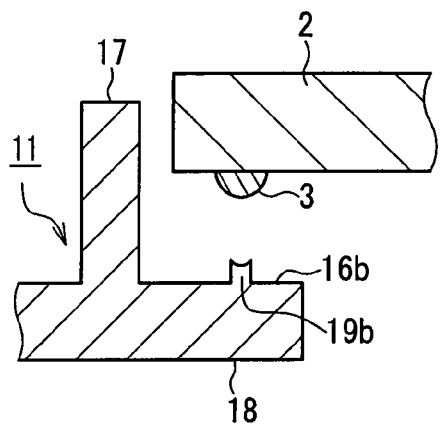
Figure 4D:
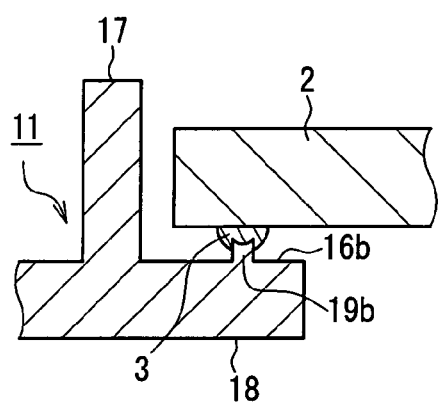

FIG. 4C illustrates an inner lead portion 16b as a second example. The inner lead portion 16b has a convex portion 19b having a different shape from that shown in the first example. Except for this point, the inner lead portion 16b is formed in the same manner as that in the first example. The convex portion 19b has its upper surface formed in a concave shape. FIG. 4D shows the state where the semiconductor element 2 with the bump 3 is bonded to the convex portion 19b.

Figure 4E:
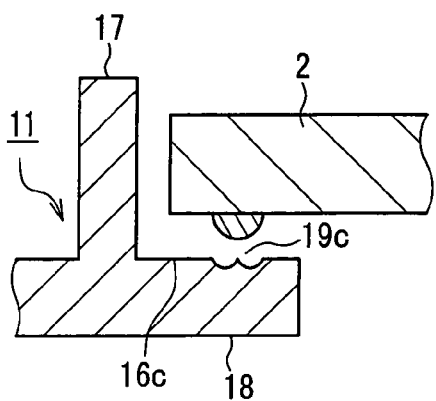

FIG. 4E illustrates an inner lead portion 16c as a third example. The inner lead portion 16c has the same configuration as that in the first example except for circular concave portions 19c having a pointed protrusion lower than an upper surface of the inner lead portion 16c. When the circular concave, portions 19c are bonded to the bump 3, the pointed protrusion at the center thereof intrudes into the bump 3 in a wedge shape.

The first external terminal portion 18 in this embodiment has a length of, for example, 0.2 to 0.6 mm. The inner lead portions 16a to 16c have a length of, for example, 0.5 to 2.0 mm and a width of, for example, 0.1 to 0.40 mm. The inner lead portions 16a to 16c have a thickness of, for example, 0.1 to 0.20 mm. The thickness of each of the inner lead portions 16a to 16c including the convex portion formed as the second external terminal portion 17 amounts to 0.1 to 0.4 mm. This thickness is approximately within a range of a resin thickness of the resin-encapsulated semiconductor device. The concave/convex protrusions 19a and 19b at the ends of the inner lead portions 16a and 16b, respectively, approximately have a height of 0.02 to 0.1 mm and a size of φ 0.03 to 0.1 mm. The semiconductor element 2 usually has a size in a range of 1.0×1.0 mm to 12.0×12.0 mm and a thickness of approximately 0.05 to 0.15 mm. The level difference generated by the circular concave portions 19c in the inner lead portion 16c in FIG. 4E is approximately 0.02 to 0.10 mm.

Figure 5A:
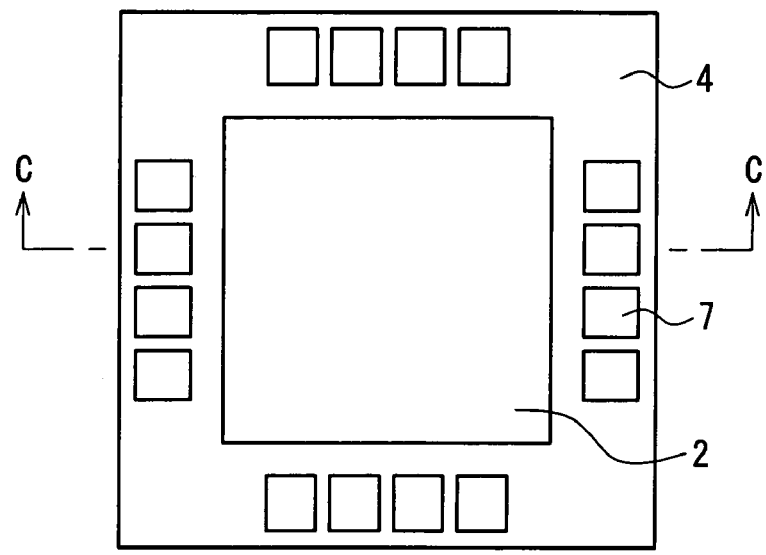
FIG. 5A is a plan view illustrating an exemplary resin-encapsulated semiconductor device in which a semiconductor element is stacked.
Figure 5B:
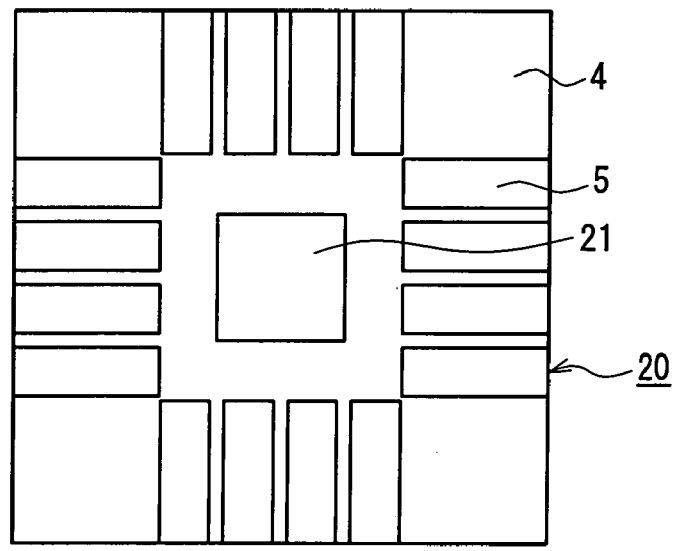
FIG. 5B is a back view thereof.
Figure 5C:
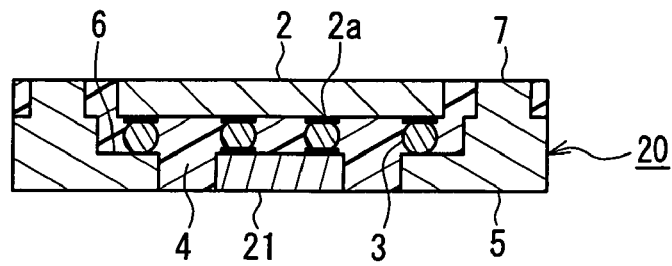
FIG. 5C is a cross-sectional view thereof taken along line C-C in FIG. 5A.

FIGS. 5A to 5C illustrates an exemplary resin-encapsulated semiconductor device in which semiconductor elements are stacked; FIG. 5A is a plan view, FIG. 5B is a back view, and FIG. 5C is a cross-sectional view taken along line C-C in FIG. 5A.

The resin-encapsulated semiconductor device has a configuration in which a first semiconductor element 2 is mounted on an upper surface of a lead frame 20 and a second semiconductor element 21 is mounted on a lower surface of the first semiconductor element 2. A connection part located between the lead frame 20 and the first semiconductor element 2 and a connection part located between the first and second semiconductor elements 2 and 21 are encapsulated with an encapsulating resin 4. The lead frame 20 includes a plurality of first external terminal portions 5 arranged on a back surface of the encapsulating resin 4 as shown in FIG. 5B, inner lead portions 6 formed of back surfaces of the first external terminal portions 5, and second external terminal portions 7 formed of uppermost surfaces of convex portions positioned in a part of the respective inner lead portions 6. The inner lead portions 6 are arranged at regular intervals so as to surround a region inside the inner lead portions.

As shown in FIG. 5C, the first semiconductor element 2 is flip-chip bonded to ends of the inner lead portions 6 via metal bumps 3. The second semiconductor element 21 smaller than the first semiconductor element 2 is flip-chip bonded in advance to a region inside the flip-chip bonded parts of the first semiconductor element 2. The thickness of the laminate formed of the first and second semiconductor elements 2 and 21 is set not to be greater than the total thickness of the lead frame 20.

A bottom surface, an upper surface, and outer lateral surfaces of the lead frame 20 exposed from the encapsulating resin 4 form the first external terminal portions 5 and the second external terminal portions 7. As shown in FIGS. 5A and 5B, the first external terminal portions 5 and the second external terminal portions 7 are exposed on surfaces of the encapsulating resin 4, which allows a plurality of semiconductor devices having external terminals at corresponding positions to be stacked.

Figure 6A:
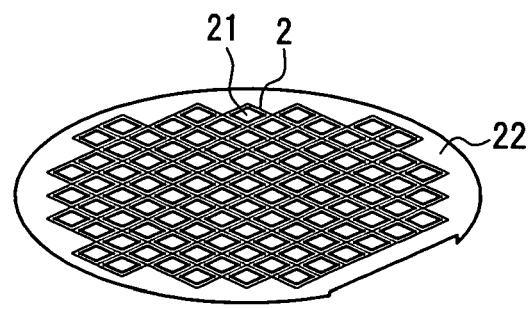
FIGS. 6A to 6D illustrate a part of a manufacturing process of the resin-encapsulated semiconductor device.
Figure 6B:
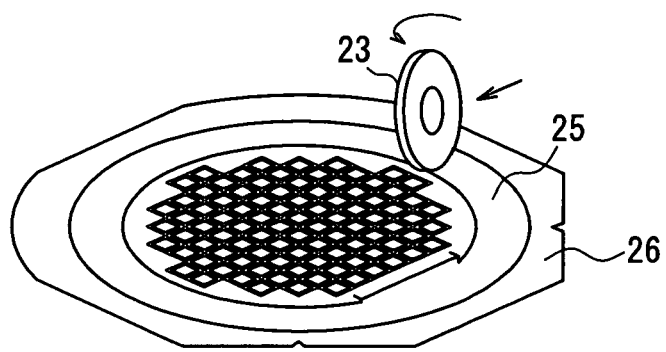
Figure 6C:
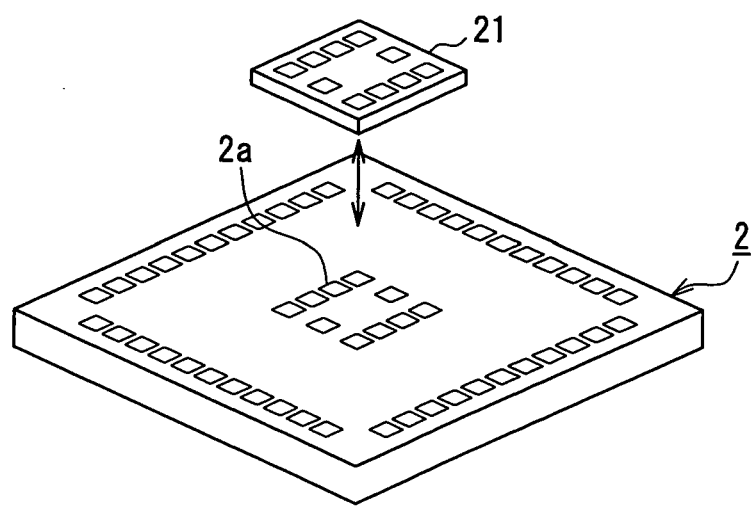
Figure 6D:
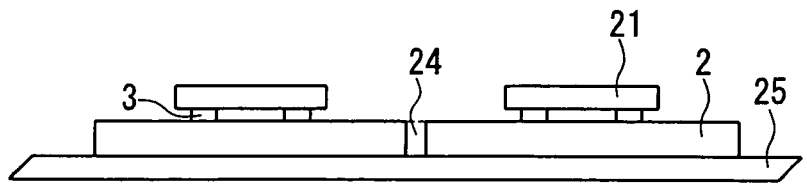

FIGS. 6A to 6D illustrate a part of a manufacturing process of the resin-encapsulated semiconductor device shown in FIGS. 5A to 5C, i.e., a step of flip-chip bonding between the first and second semiconductor elements. FIGS. 6A and 6B are perspective views illustrating the step, FIG. 6C is an enlarged perspective view of a part of FIG. 6A, and FIG. 6D is an enlarged side view of a part of FIG. 6C.

Initially, as shown in FIGS. 6A and 6C, Au stud bumps are formed on electrode pads 2a of each of the first semiconductor elements 2 on a semiconductor wafer 22 examined in advance, and the second semiconductor element 21 is flip-chip bonded thereto. Then, as shown in FIG. 6B, the semiconductor wafer 22 to which each of the second semiconductor elements 21 is flip-chip bonded is subjected to dicing with a blade 23 along a dividing line 24 shown in FIG. 6D, thereby dividing the semiconductor wafer 22 into each of the first semiconductor elements 2. At this time, the semiconductor wafer 22 is held by a holding ring 25 and a dicing sheet 26.

The bumps 3 formed on the electrode pads 2a of the first semiconductor element 2 have, for example, a diameter in a planar shape of approximately φ 0.05 to 0.1 mm and a height of approximately 0.02 to 0.1 mm. Each of the first and second semiconductor elements 2 and 21 is prepared in the following manner: circuits are formed on a surface of a semiconductor substrate made of a single crystal silicon base material, then Cu wiring patterns with a thickness of 30 nm to 1000 nm, for example, are formed, and the circuits are connected with respective electrode pads.

In order to maintain the bonding reliability against impacts such as ultrasonic waves, loads, and heat applied when the electrode pads 2a are bonded to ends of the inner lead portions and the bonding reliability after the semiconductor device is assembled, the electrode pads 2a are provided with a plurality of (3 to 4) ALCu layers that are brought into conduction by W, Ti, TiN, or the like, the uppermost surface thereof being covered with AL or Pd, Au, or the like by a CVD method or the like. The bumps 3 are made of, for example, SnPb by a plating method, and Au at a purity not less than 99.99%, which is a material for forming a bump called a stud bump, by a mechanical method. When Au is used for the bumps 3, a conductive paste such as an AgPd paste may be used when the bumps 3 are bonded to the ends of the inner lead portions 6, thereby ensuring the bonding property.

Embodiment 2

Figure 7A:
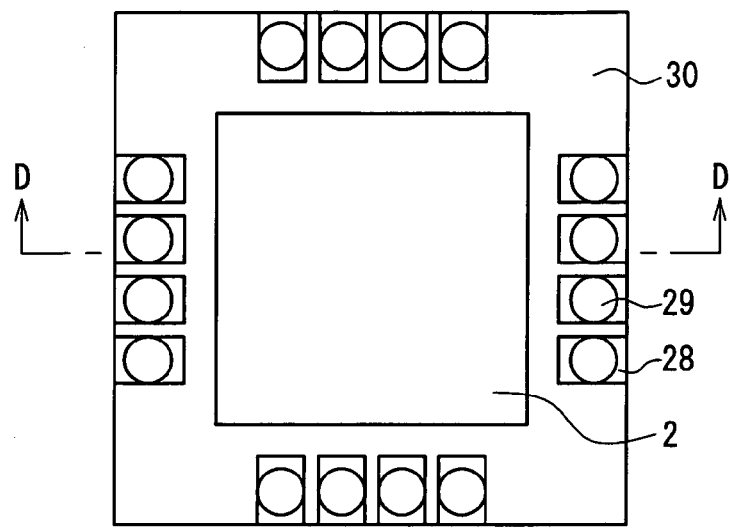
FIG. 7A is a plan view illustrating a resin-encapsulated semiconductor device according to Embodiment 2.
Figure 7B:
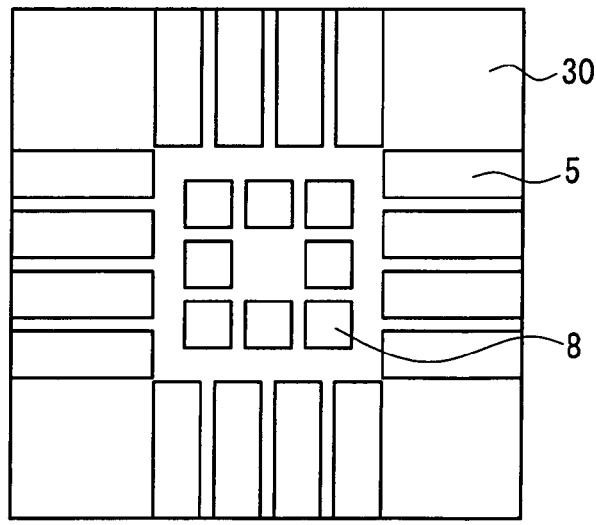
FIG. 7B is a back view thereof.
Figure 7C:
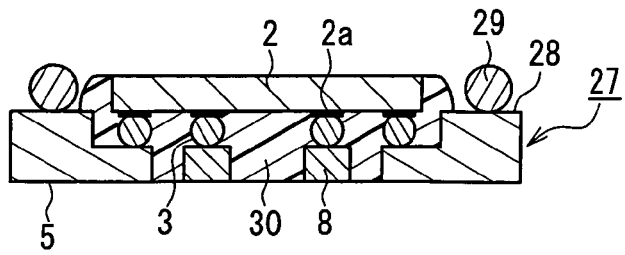
FIG. 7C is a cross-sectional view thereof taken along line D-D in FIG. 7A.

FIG. 7A is a plan view illustrating a resin-encapsulated semiconductor device according to Embodiment 2, FIG. 7B is a back view thereof, and FIG. 7C is a cross-sectional view thereof taken along line D-D in FIG. 7A. FIGS. 8A to 8G illustrate a manufacturing process of the resin-encapsulated semiconductor device shown in FIGS. 7A to 7C.

Figure 8E:
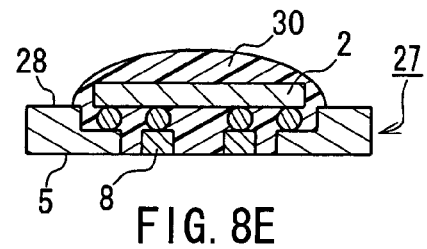
Figure 9A:
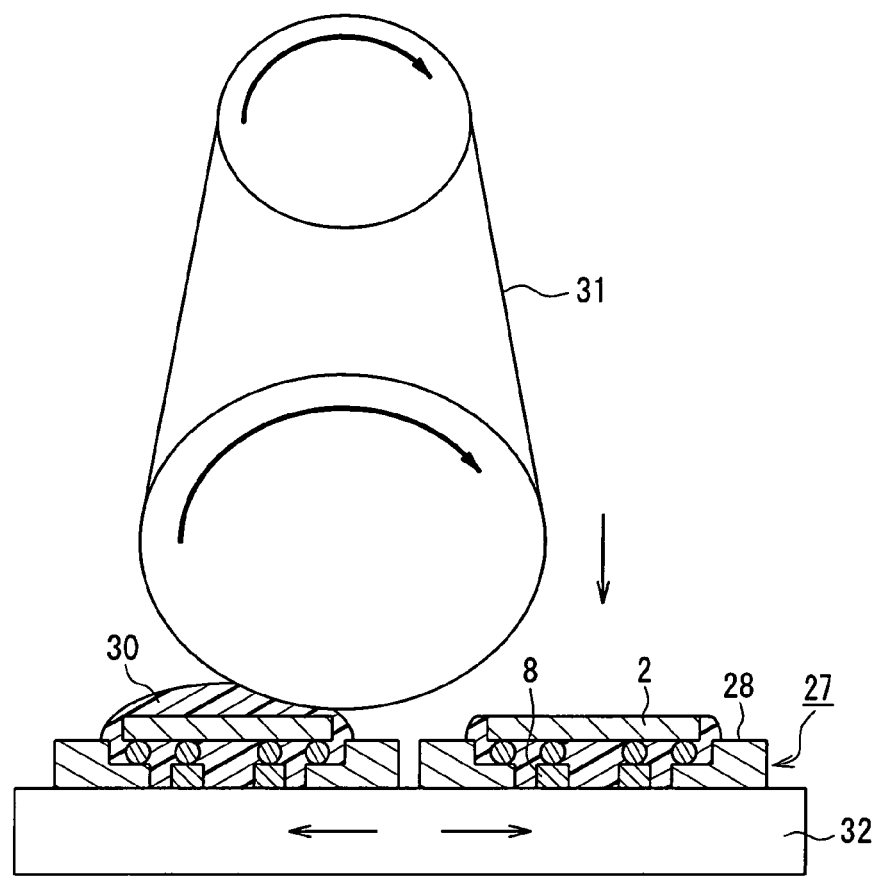
FIGS. 9A and 9B are a cross-sectional view and a plan view, respectively, illustrating the step of FIG. 8F in detail.
Figure 9B:
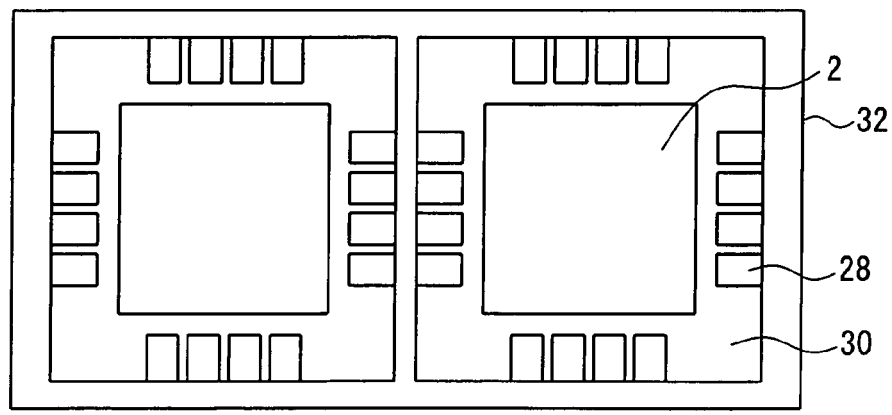

In this embodiment, as shown in FIG. 7C, second external terminal portions 28 of a lead frame 27 have a slightly different shape from that shown in the above embodiment, that is, have larger areas, on which solder balls 29 are provided. Further, in this embodiment, an encapsulating resin 30 is provided by potting as shown in FIG. 8E, although injection molding is conducted in the case shown in FIG. 2E. Furthermore, as shown in FIGS. 9A and 9B, a step of grinding the resin is carried out.

Figure 8A:
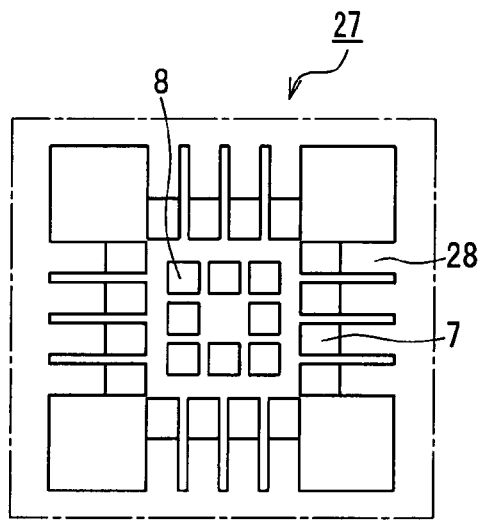
FIG. 8A is a plan view of a lead frame for illustrating a part of a manufacturing process of the resin-encapsulated semiconductor device.

FIG. 8A is a plan view of the lead frame 27. FIG. 8B is a plan view of the resin-encapsulated semiconductor device manufactured by the process. FIGS. 8C to 8G are cross-sectional views taken along line E-E in FIG. 8B that illustrate respective steps of the process.

Figure 8C:
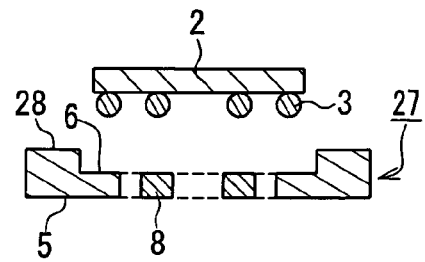
FIGS. 8C to 8G are cross-sectional views of respective steps of the process.
Figure 8D:
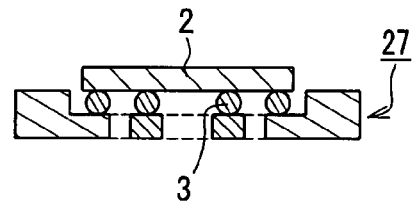
Figure 8B:
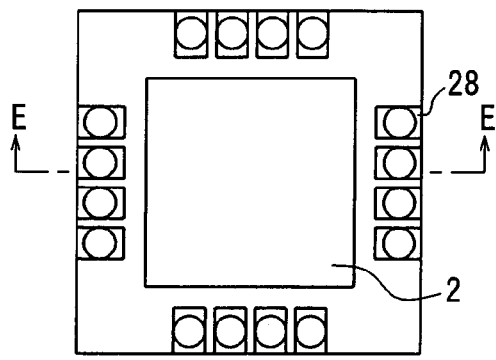
FIG. 8B is a back view of the resin-encapsulated semiconductor device manufactured by the process.

Initially, as shown in FIG. 8C, the lead frame 27 and a semiconductor element 2 provided with bumps 3 are prepared. Then, as shown in FIG. 8D, the semiconductor element 2 is mounted on the lead frame 27. In other words, electrode pads 2a of the semiconductor element 2 are connected with inner lead portions 6 of the lead frame 27 via the bumps 3.

Then, as shown in FIG. 8E, the semiconductor element 2 and the inner lead portions 6 of the lead frame 27 are encapsulated with the resin 30 through a potting step. Herein, first external terminal portions 5, second external terminal portions 28, and terminals 8 of the lead frame 27 are exposed on a surface of the resin 30. The potting makes it unnecessary to use an expensive encapsulating mold. The lead frame to which the semiconductor element is bonded is disposed on a bench and filled with the resin 30 by the potting method. Thereafter, the resin 30 is cured by heat at a temperature of 150° C. for 2 hours, for example.

Figure 8F:
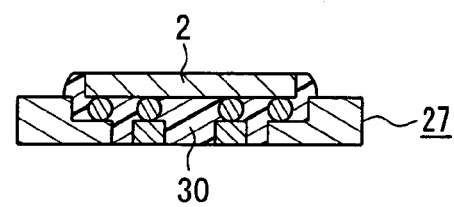
Figure 8G:
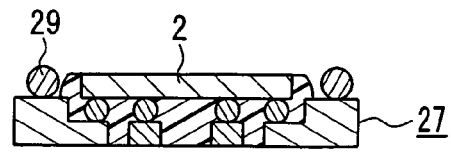

Then, as shown in FIG. 8F, unwanted resin is removed in a grinding step. After that, as shown in FIG. 8G, the solder balls 29 may be provided.

FIGS. 9A and 9B show more specifically an example of the grinding step for removing the unwanted resin as shown in FIG. 8F. FIG. 9A is a cross sectional view, and FIG. 9B is a plan view illustrating the semiconductor device obtained after the grinding. As shown in FIG. 9A, a belt grinding method using a grinding belt 31 is used. The grinding belt 31 whose surface is impregnated with a grinding agent is rotated at a high velocity of 7000 rpm to 30000 rpm. The semiconductor device 2 is placed on a grinding board 32, and the grinding board 32 is driven back and forth. Although cutting oil is used conventionally to grind metal materials, wash water is used to grind semiconductor devices. The grinding belt 31 goes down in steps of several μM to grind the encapsulating resin 30. The belt grinding method is very efficient in grinding a strip-shaped work such as the lead frame that is encapsulated with the resin in a block form, as compared with a back grinding method with a grinding stone wheel that is used generally to grind semiconductor wafers.

Although not shown in the figures, a conventionally used printing encapsulating system using a squeegee also may be used in the resin encapsulating step. In the printing encapsulating system, the unwanted resin is removed by the squeegee before it is cured, which eliminates the need for the grinding step. In general, a resin used in the potting or printing method has lower moisture resistance and physical strength than those of a thermosetting epoxy resin containing silica, which is used in injection molding. However, as semiconductor devices become considerably thinner than conventional ones and thus requires a smaller amount of encapsulating resin, there is an increasing acceptability in using such a resin used in the potting or printing method.

Figure 10A:
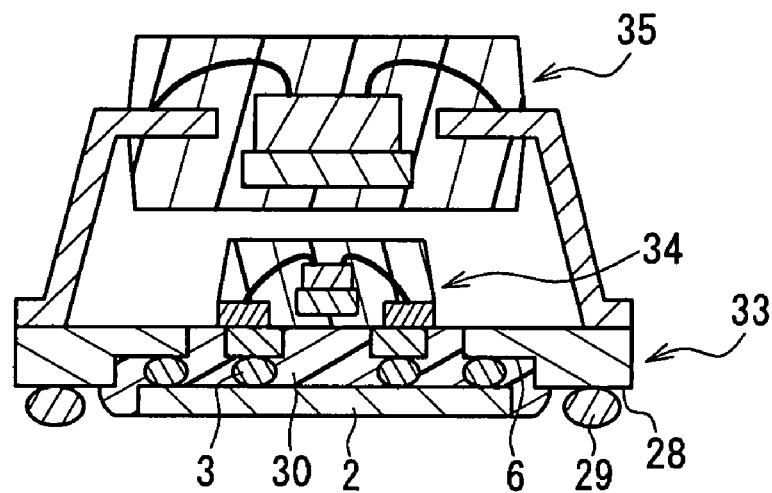
FIGS. 10A and 10B are a cross-sectional view and a back view, respectively, showing an example of the packaging of the resin-encapsulated semiconductor device shown in FIGS. 7A to 7C.
Figure 10B:
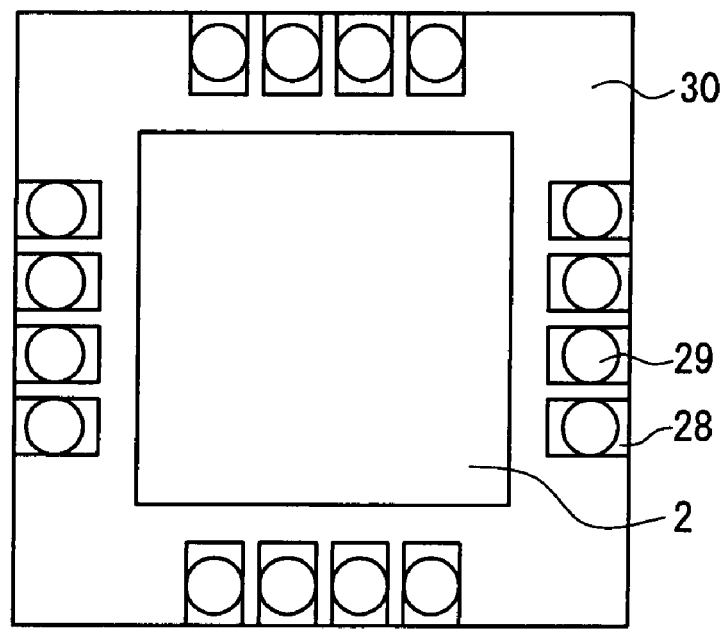

FIGS. 10A and 10B illustrate an example of packaging the resin-encapsulated semiconductor device shown in FIGS. 7A and 7C; FIG. 10A is a cross-sectional view and FIG. 10B is a back view. A semiconductor device 33 of this embodiment is packaged in combination with an SON (Small Outline Package) semiconductor device 34 with small pins and a QFP semiconductor device 35 that are provided on the semiconductor device 33. In this manner, the semiconductor device of this embodiment allows commercially available semiconductor devices to be stacked thereon easily. Therefore, such a semiconductor device can be obtained at a lower cost than a semiconductor device in which a plurality of semiconductor elements are incorporated.

Embodiment 3

Figure 11A:
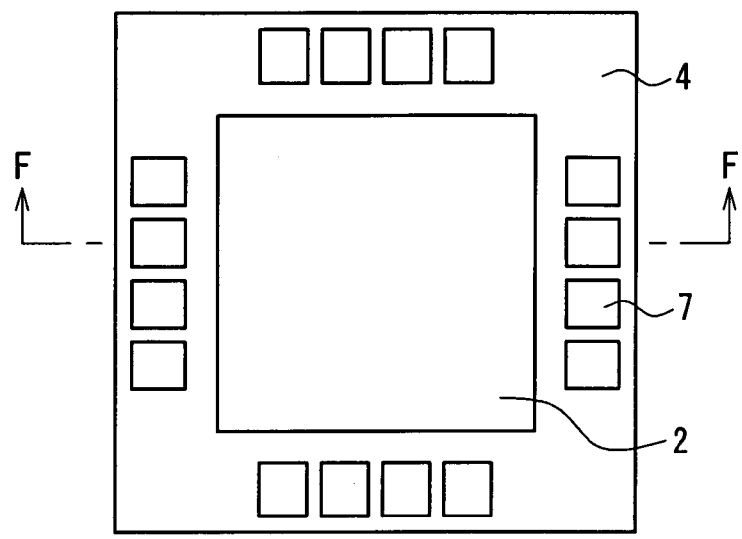
FIG. 11A is a plan view illustrating a resin-encapsulated semiconductor device according to Embodiment 3.
Figure 11B:
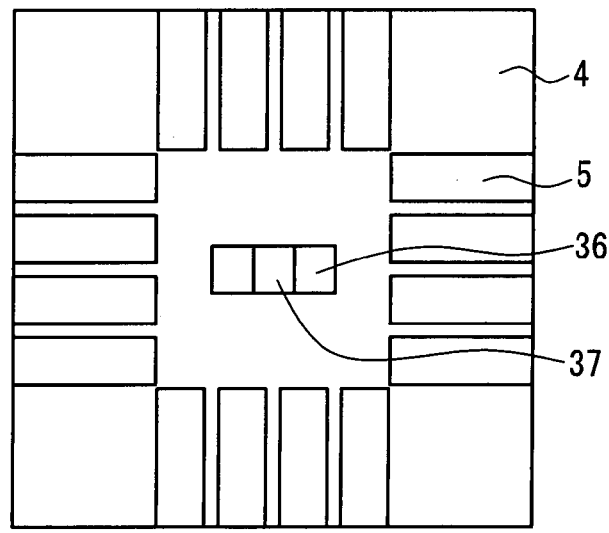
FIG. 11B is a back view thereof.
Figure 11C:
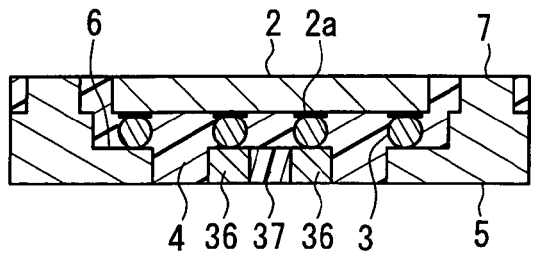
FIG. 11C is a cross-sectional view thereof taken along line F-F in FIG. 11A.

FIG. 11A is a plan view illustrating a resin-encapsulated semiconductor device according to Embodiment 3, FIG. 11B is a back view thereof, and FIG. 11C is a cross-sectional view thereof taken along line F-F in FIG. 1A. The resin-encapsulated semiconductor device basically has the same structure as that shown in FIGS. 1A to 1C. In the resin-encapsulated semiconductor device of this embodiment, a resin 37 with a high dielectric constant is sandwiched between two terminals 36 provided in a region inside inner lead portions 6.

This configuration allows a formation of a resistor. In general, a resistor (square shape) is formed by printing and baking a thick film paste on an aluminum ceramic substrate. As the thick film paste to become a resistor, a ruthenium-oxide ($RuO_2$)-based paste is used. Such a ruthenium-oxide($RuO_2$-based paste also can be used as the resin 37 with a high dielectric constant of this embodiment, and it is injected between the two terminals by a dispenser system and then cured. A manufacturing process of the resin-encapsulated semiconductor device is shown in FIGS. 12A to 12F.

Figure 12A:
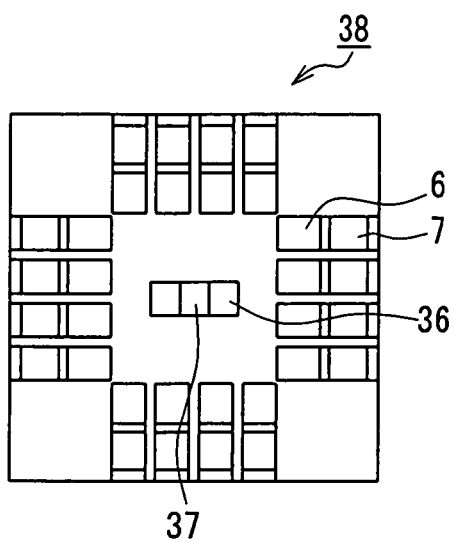
FIG. 12A is a plan view of a lead frame for illustrating a part of a manufacturing process of the resin-encapsulated semiconductor device.
Figure 12B:
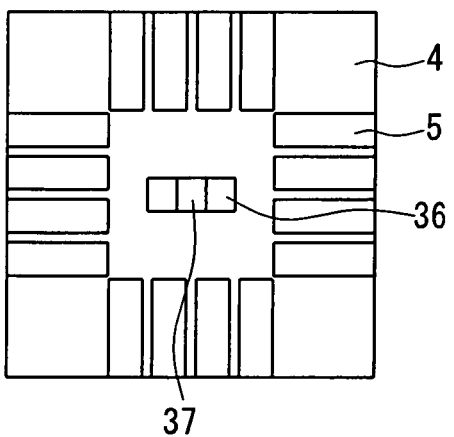
FIG. 12B is a back view of the resin-encapsulated semiconductor device manufactured by the process.
Figure 12C:
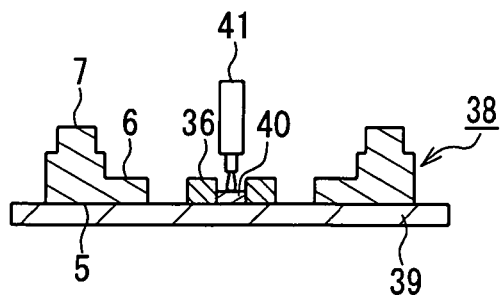
FIGS. 12C to 12F are cross-sectional views of respective steps of the process.
Figure 12D:
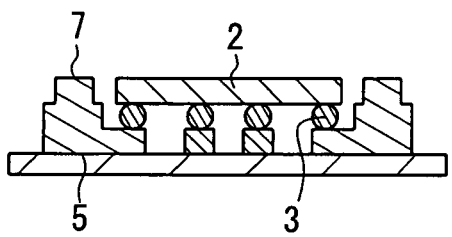
Figure 12E:
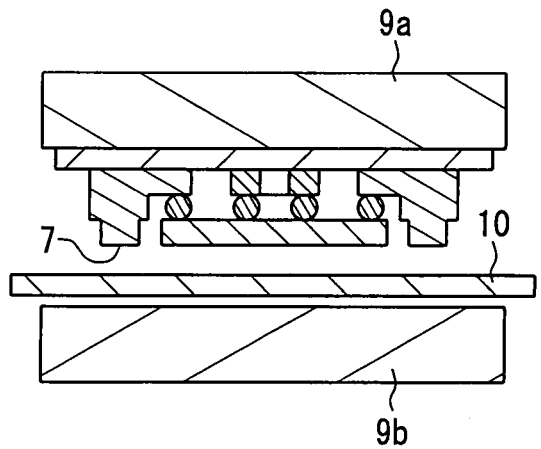
Figure 12F:
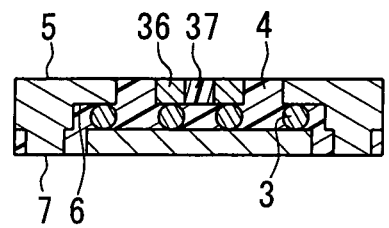

FIG. 12A is a plan view of a lead frame 38. FIG. 12B is a back view of the resin-encapsulated semiconductor device manufactured by the process. FIGS. 12C to 12F are cross-sectional views of respective steps of the process. Initially, as shown in FIG. 12C, the lead frame 38 is prepared. A lower surface of the lead frame 38 is held by a lead frame holding sheet 39. A ruthenium-oxide($RuO_2$-based paste 40, for example, is injected between the terminals 36 of the lead frame 38 by a dispenser 41 and then cured. As a result, the resin 37 with a high dielectric constant is formed. Subsequent steps shown in FIGS. 12D to 12F are the same as those shown in FIGS. 2D to 2F.

Instead of providing the resin 37 with a high dielectric constant between the two terminals 36, a resistor with two terminals may be provided. In such a case, the two terminals of the resistor are provided such that regions to be an upper surface of the resistor are large enough to allow bump bonding. Further, it is also possible to provide a capacitor instead of the resistor. In the case of a chip capacitor, a dielectric material with a high dielectric constant is used. As the dielectric material, various materials such as titanium oxide and barium titanate can be used. In the case of a ceramic capacitor, it is required to make a dielectric material thin so as to increase a capacity, as well as to stack the dielectric material and an electrode material alternately. Consequently, it costs less to use commercially available capacitors than the configuration in which the resin with a high dielectric constant is injected between the two terminals.

Embodiment 4

Figure 13A:
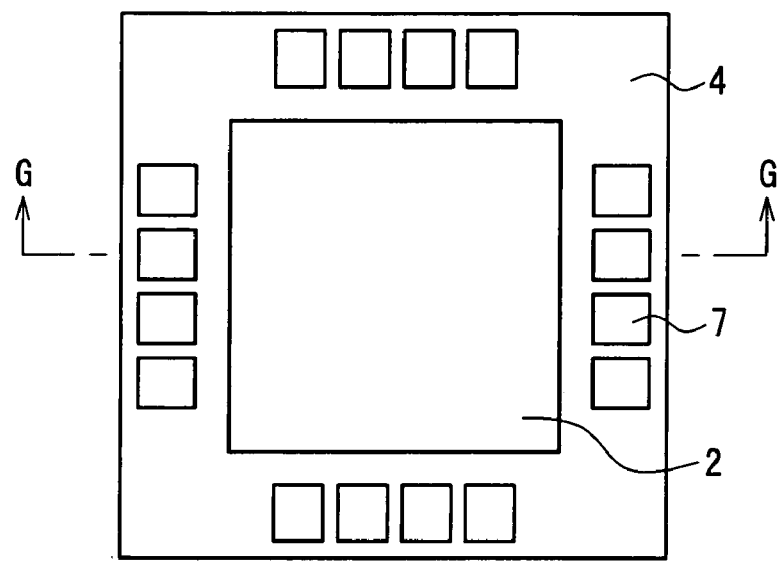
FIG. 13A is a plan view illustrating a resin-encapsulated semiconductor device according to Embodiment 4.
Figure 13B:
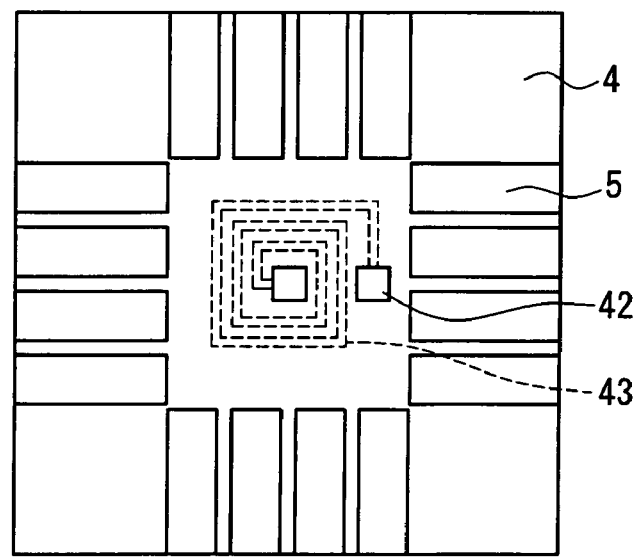
FIG. 13B is a back view thereof.
Figure 13C:
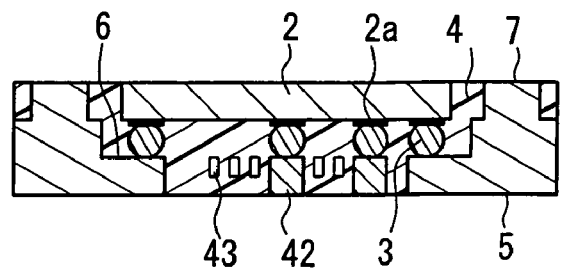
FIG. 13C is a cross-sectional view thereof taken along line G-G in FIG. 13A.

FIG. 13A is a plan view illustrating a resin-encapsulated semiconductor device according to Embodiment 4, FIG. 13B is a back view thereof, and FIG. 13C is a cross-sectional view thereof taken along line G-G in FIG. 13A. The resin-encapsulated semiconductor device basically has the same structure as that shown in FIGS. 1A to 1C. In the resin-encapsulated semiconductor device of this embodiment, two terminals 42 provided in a region inside inner lead portions 6 serve as a starting point and an ending point, respectively, of a coil 43.

Figure 14:
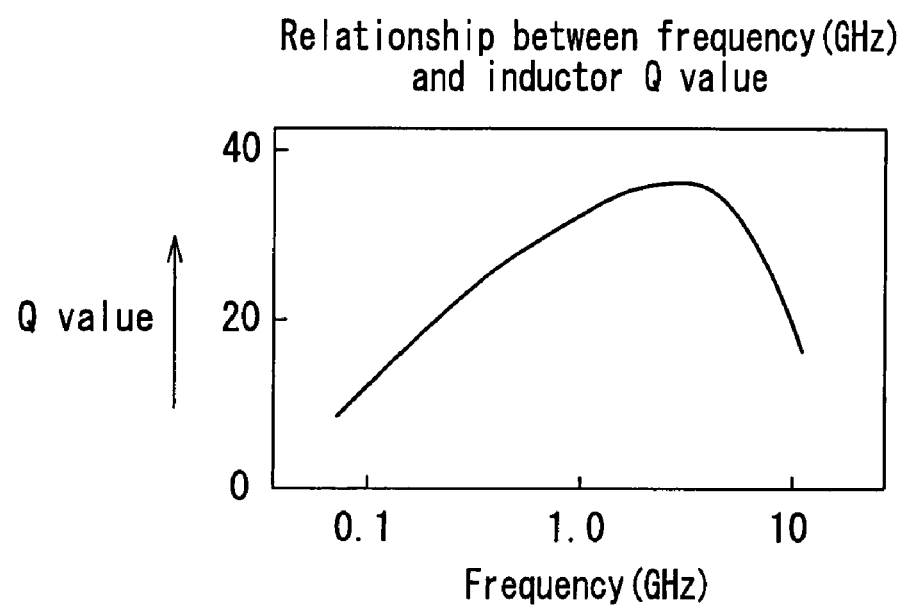
FIG. 14 is a view showing an example of the relationship between a frequency (GHz) and a Q value of an inductor.

The formation of the coil 43 allows a Q value of an inductor representing the high frequency characteristics to be increased, thereby improving the signal output characteristics. In addition, since the two terminals 42 as the starting point and the ending point, respectively, are bump-bonded to electrode pads of a semiconductor device 2 directly, output is improved by, for example, 5 dB in the case of a driver with electric signals having a high frequency of 2 GHz, as compared with the case of conventional bonding with thin metal wires. However, the coil 43 may affect other electric signals, and thus it is required to determine appropriately the design pattern layout of the semiconductor element 2 or the position of the coil. FIG. 14 shows an example of the relationship between a frequency (GHz) and the Q value of an inductor. The Q value on this curve increases as the number of turns and the thickness of the coil are increased.

Figure 15:
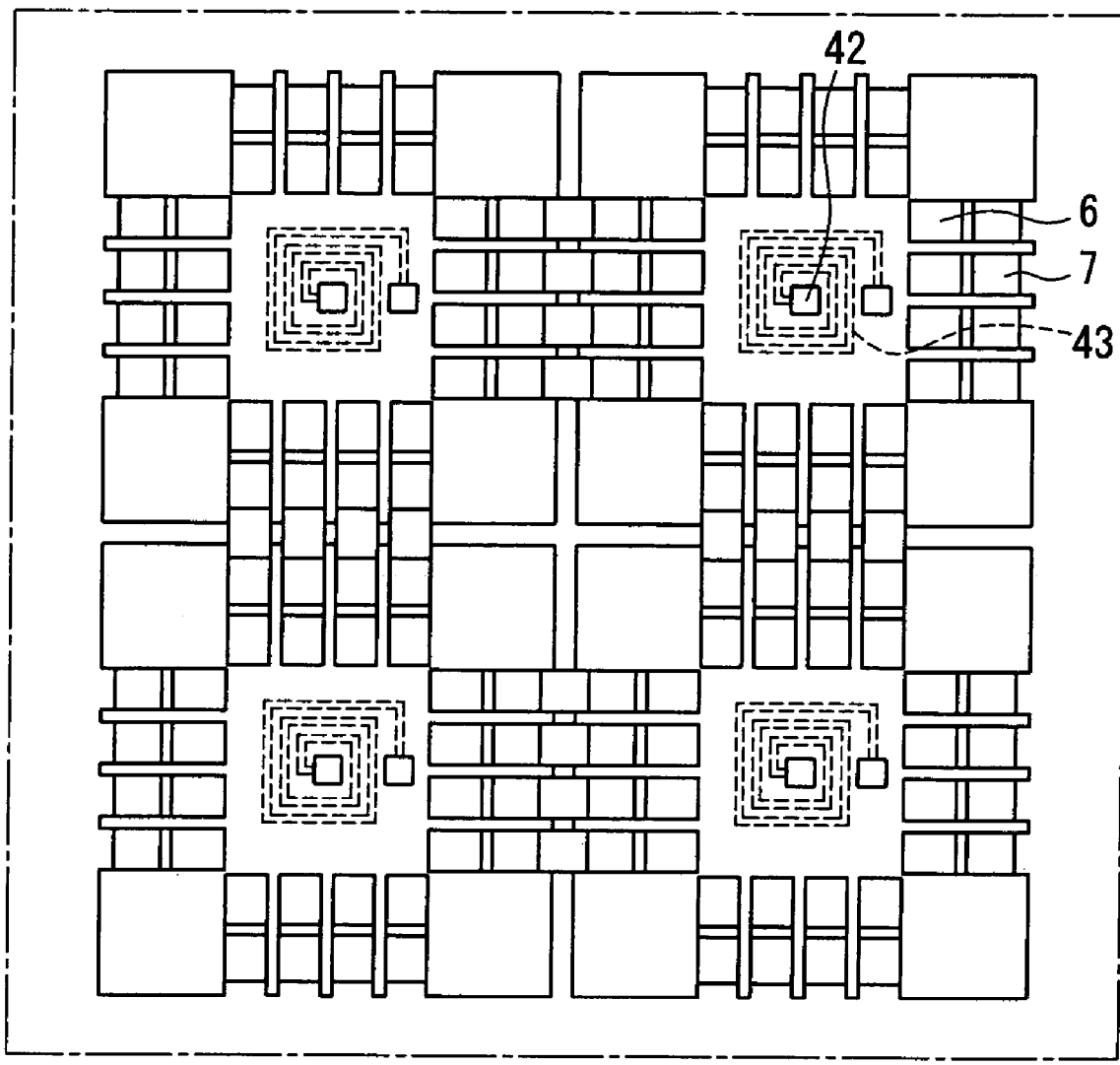
FIG. 15 is a plan view illustrating a lead frame used to manufacture the resin-encapsulated semiconductor device according to Embodiment 4.

FIG. 15 is a plan view illustrating a lead frame used to manufacture the resin-encapsulated semiconductor device of this embodiment. The shape of its periphery formed of the inner lead portions 6, second external terminal portions 7, and the like is the same as that shown in FIG. 2A. The difference from the structure shown in FIG. 2A is that the terminals 42 and the coil 43 are provided in the region inside the inner lead portions 6. The resin-encapsulated semiconductor device of this embodiment can be manufactured using this lead frame through respective steps shown in FIGS. 16A to 16F. FIGS. 16A to 16F are cross-sectional views taken along line G-G in FIG. 13A that illustrate a process for manufacturing the resin-encapsulated semiconductor device shown in FIGS. 13A to 13C.

Figure 16A:
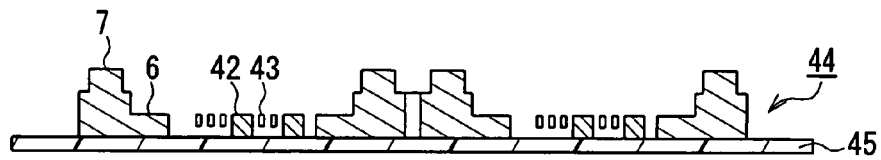
FIGS. 16A to 16F are cross-sectional views illustrating a part of a manufacturing process of the resin-encapsulated semiconductor device.
Figure 16B:
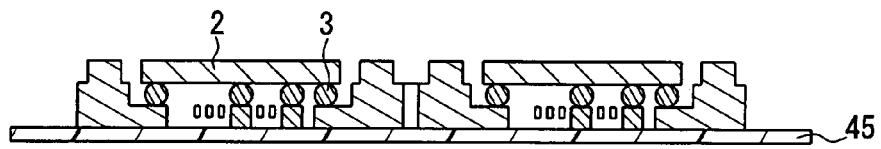

Initially, as shown in FIG. 16A, a lead frame 44 with a coil 43 provided between terminals 42 is prepared. A lower surface of the lead frame 44 is held by a lead frame holding sheet 45. Then, as shown in FIG. 16B, semiconductor elements 2 are mounted on the lead frame 44. In other words, electrode pads 2a of each of the semiconductor elements 2 are connected with the inner lead portions 6 of the lead frame 44 via bumps 3.

Figure 16C:
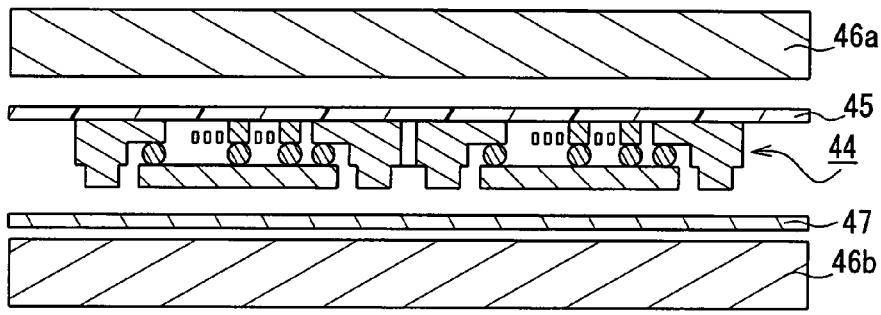
Figure 16D:
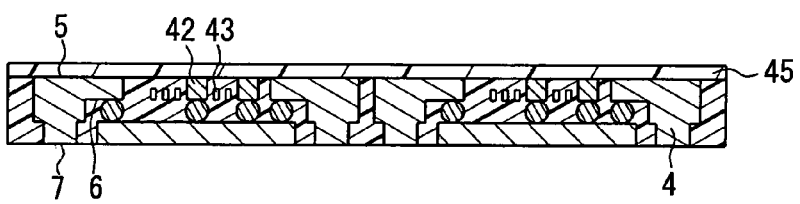
Figure 16E:
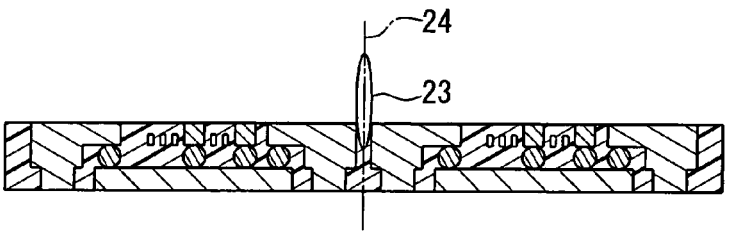
Figure 16F:

Then, the semiconductor elements 2 and the inner lead portions 6 of the lead frame 44 are encapsulated with an encapsulating resin 4. More specifically, as shown in FIG. 16C, the lead frame 44 to which the semiconductor elements 2 have been bonded is placed between resin encapsulating molds 46a and 46b, which is then filled with the encapsulating resin 4. At this time, an encapsulating sheet 47 may be provided between the lead frame 44 and the encapsulating mold 46b. A molded body taken out from the resin encapsulating molds 46a and 46b as shown in FIG. 16D is cut by a blade 23 along a dividing line 24 as shown in FIG. 16E, thereby obtaining individual resin-encapsulated semiconductor devices as shown in FIG. 16F.

Embodiment 5

Figure 17A:
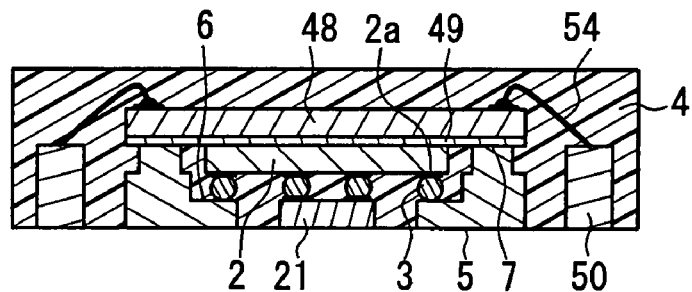
FIGS. 17A and 17B are a cross-sectional view and a plan view, respectively, illustrating a resin-encapsulated semiconductor device according to Embodiment 5.
Figure 17B:
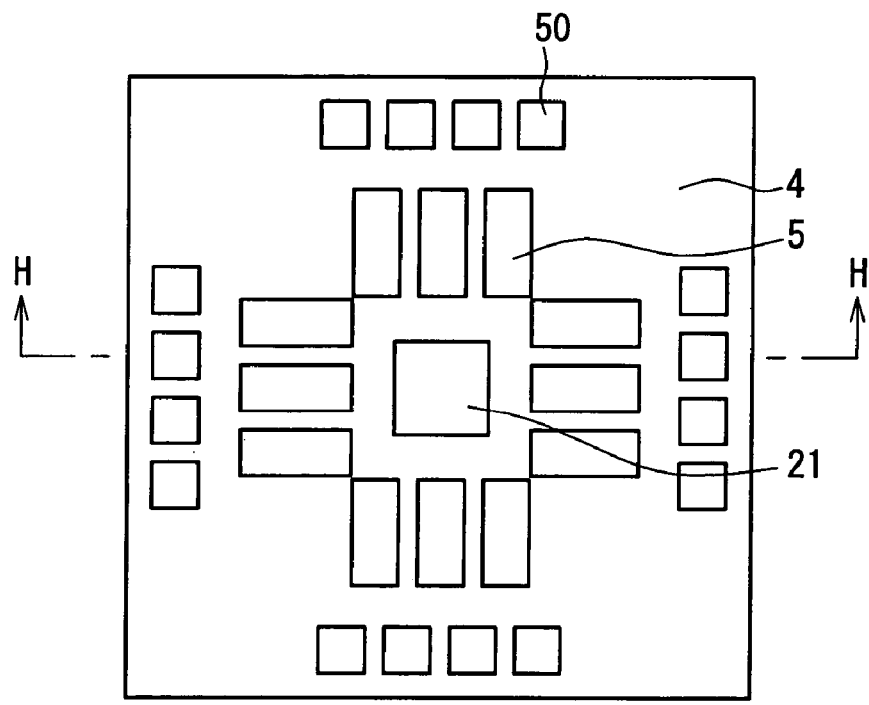
Figure 18A:
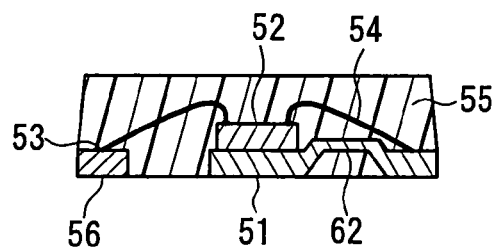
FIGS. 18A to 18D illustrate a conventional resin-encapsulated semiconductor device.
Figure 18B:
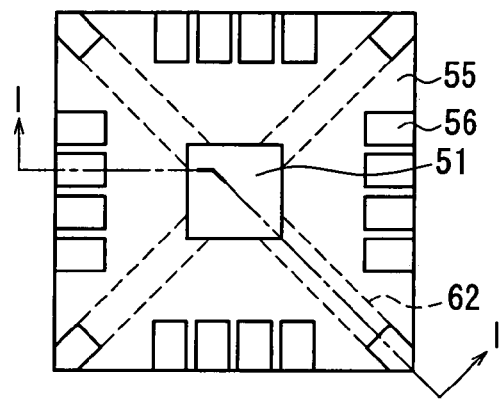
Figure 18C:
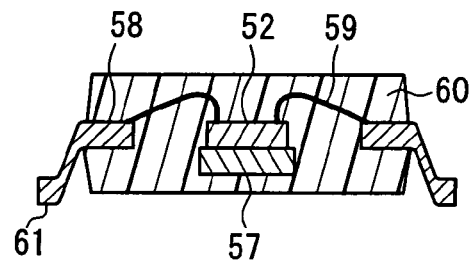
Figure 18D:
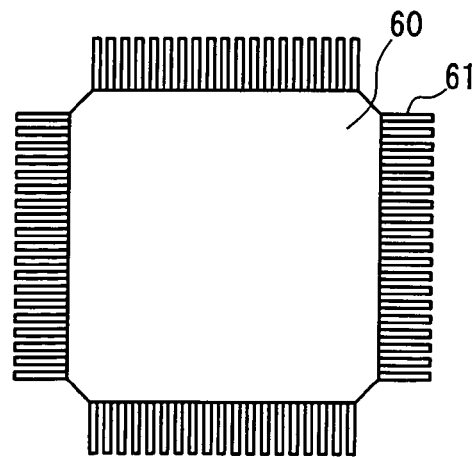

FIG. 17A is a cross sectional view illustrating a resin-encapsulated semiconductor device according to Embodiment 5, and FIG. 17B is a plan view thereof FIG. 17A shows a cross section taken along line H-H in FIG. 17B. In the resin-encapsulated semiconductor device of this embodiment, a third semiconductor element 48 further is adhered with an adhesive 49 to upper surfaces of second external terminal portions 7 provided on the periphery of the semiconductor device as shown in FIGS. 5A to 5C, and terminals (inner lead posts) 50 are provided outside the second external terminal portions 7. The third semiconductor element 48 is connected electrically with the terminals 50 via thin metal wires 54.

Further, by arranging the external terminal portions in accordance with the design based on the external standards of a semiconductor device created by the IEC (International Electrotechnical Commission) or the JEITA (Japan Electronics and Information Technology Industries Association), it is also possible to mount commercially available electronic components or semiconductors on the resin-encapsulated semiconductor device of the present invention.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A resin-encapsulated semiconductor device comprising:
a lead frame comprising a plurality of first external terminal portions provided on a plane, a plurality of inner lead portions configured to be connected electrically with a semiconductor element, formed of back surfaces of the respective first external terminal portions and arranged at regular intervals so as to surround a region inside the inner lead portions, a plurality of step-like shaped convex portions including the inner lead portions formed as the lowermost stage of the convex portions, the uppermost surfaces of the convex portions forming a plurality of second external terminal portions;
the semiconductor element comprising a plurality of connection pads flip-chip bonded to the inner lead portions via bumps; and
an encapsulating resin that encapsulates at least a part of surroundings of the semiconductor element including the inner lead portions and connection pads,
the first external terminal portions being arranged in a lower surface region of the encapsulating resin along a periphery of the region and the second external terminal portions being exposed on an upper surface of the encapsulating resin,
wherein the convex portion has a top stage forming the uppermost surface of the convex portion and a middle stage higher than the inner lead portion connected with the connection pad of the semiconductor element, and
wherein the lead frame further comprises a plurality of terminals for electrical connection provided in a grid pattern in a region inside the inner lead portions and exposed on a lower surface of the encapsulating resin,
the semiconductor element further comprise a plurality of inner electrode pads within the region inside the lead portions; and
the plurality of inner terminals are connected to the inner electrode pads of the semiconductor element.

2. The resin-encapsulated semiconductor device according to claim 1, wherein the plurality of terminals for electrical connection that comprise two terminals form a starting point and an ending point, respectively, of a spiral coil.

3. The resin-encapsulated semiconductor device according to claim 1, wherein the plurality of terminals for electrical connection comprise two terminals with a resin having a high dielectric constant sandwiched therebetween.

4. The resin-encapsulated semiconductor device according to claim 1, wherein a second semiconductor element that is smaller than a region inside inner ends of the inner lead portions and thinner than the inner lead portions of the lead frame is further flip-chip bonded to the inner electrode pads.

5. The resin-encapsulated semiconductor device according to claim 4, wherein a back surface of a third semiconductor element is bonded on the second external terminal portions via an adhesive, and a plurality of inner lead posts are provided in a region outside the inner lead portions, the inner lead posts being connected electrically with electrode pads of the third semiconductor element via thin metal wires, and having their opposite surfaces exposed in the lower surface region of the encapsulating resin.

6. A lead frame comprising:
a plurality of first external terminal portions provided on a plane;
inner lead portions that are configured to be connected electrically with a semiconductor element, the inner lead portions formed of back surfaces of the respective first external terminal portions and arranged at regular intervals so as to surround a region inside the inner lead portions; and
step-like shaped convex portions including the inner lead portions formed as the lowermost stage of the convex portions, the uppermost surfaces of the convex portions forming second external terminal portions,
wherein the convex-portion has a top stage forming the uppermost surface of the convex portion and a middle stage higher than the inner lead portion connected with the connection pads of the semiconductor element, and
a plurality of terminals for electrical connection are provided in a grid pattern in the region inside the inner lead portions.

7. The lead frame according to claim 6, wherein spiral wiring is provided in the region inside the inner lead portions, and the terminals for electrical connection form a starting point and an ending point, respectively, of the spiral wiring.

8. The lead frame according to claim 6, wherein the plurality of terminals for electrical connection comprise two terminals with a resin having a high dielectric constant sandwiched therebetween.

9. The lead frame according to claim 6, further comprising an insulating protective sheet for supporting the inner lead portions, the second external terminal portions and the plurality of terminals.

10. The resin-encapsulated semiconductor device according to claim 1, wherein one or more of the terminals is electrically connected to a power source or ground.

11. The resin-encapsulated semiconductor device according to claim 1, wherein a lateral surface of the lead frame is covered with the encapsulating resin at an area between the top stage and the middle stage of the convex portion, and is exposed from the encapsulating resin at an area under the middle stage of the convex portion.

* * * * *